(12) United States Patent
Chung et al.

(10) Patent No.: US 10,438,667 B2
(45) Date of Patent: Oct. 8, 2019

(54) STORAGE DEVICE AND OPERATION METHOD THEREOF

(71) Applicant: Silicon Motion, Inc., Jhubei, Hsinchu County (TW)

(72) Inventors: Ming-Kun Chung, Zhunan Township, Miaoli County (TW); Sheng-Fa Wang, Nantou (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 161 days.

(21) Appl. No.: 15/623,609

(22) Filed: Jun. 15, 2017

(65) Prior Publication Data

US 2017/0372787 A1 Dec. 28, 2017

Related U.S. Application Data

(60) Provisional application No. 62/354,858, filed on Jun. 27, 2016.

(30) Foreign Application Priority Data

Mar. 30, 2017 (TW) .............................. 106110755 A

(51) Int. Cl.
*G05B 11/01* (2006.01)
*G06F 13/16* (2006.01)
(Continued)

(52) U.S. Cl.
CPC .............. *G11C 16/30* (2013.01); *G05B 11/01* (2013.01); *G06F 13/1668* (2013.01);
(Continued)

(58) Field of Classification Search
CPC . G11C 16/30; G06F 13/1668; G06F 13/4022; G06F 13/4068; H01R 24/60; H01R 2107/00; G05B 11/01
(Continued)

(56) References Cited

U.S. PATENT DOCUMENTS

| 2005/0122648 A1 | 6/2005 | Wu et al. |
| 2007/0008403 A1 | 1/2007 | Huang et al. |
| 2013/0093240 A1* | 4/2013 | Lin ...................... H02J 7/0042 307/11 |

FOREIGN PATENT DOCUMENTS

| CN | 2821695 Y | 9/2006 |
| JP | 2009026175 A | 2/2009 |

(Continued)

*Primary Examiner* — Hal Kaplan
(74) *Attorney, Agent, or Firm* — McClure, Qualey & Rodack, LLP

(57) ABSTRACT

A storage device is provided. The storage device includes a first connector, a second connector, and a memory circuit. The first connector is selectively electrically connected to a first electronic device. The second connector is selectively electrically connected to a second electronic device. The memory circuit is disposed between the first connector and the second connector. When the first connector is electrically connected to a first electronic device and the second connector is electrically connected to a second electronic device, the second connector is switched to a charge mode from a device mode, so that the first electronic device charges the second electronic device through the storage device, the second electronic device does not provide power to the storage device through the storage device, and the first electronic device accesses data in the storage device through the first connector.

20 Claims, 7 Drawing Sheets

(51) Int. Cl.
*G06F 13/40* (2006.01)
*G11C 16/30* (2006.01)
*H01R 24/60* (2011.01)
*H01R 107/00* (2006.01)

(52) U.S. Cl.
CPC ...... *G06F 13/4022* (2013.01); *G06F 13/4068* (2013.01); *H01R 24/60* (2013.01); *H01R 2107/00* (2013.01)

(58) Field of Classification Search
USPC .......................................................... 307/31
See application file for complete search history.

(56) References Cited

FOREIGN PATENT DOCUMENTS

| | | | |
|---|---|---|---|
| JP | 2009276828 A | 11/2009 | |
| TW | 200703000 A | 1/2007 | |
| TW | 201335836 A | 9/2013 | |
| WO | 2012/044937 A1 | 4/2012 | |

* cited by examiner

STORAGE DEVICE AND OPERATION METHOD THEREOF

CROSS REFERENCE TO RELATED APPLICATIONS

This application claims the benefit of U.S. Provisional Application No. 62/354,858, filed on Jun. 27, 2016, the contents of which are incorporated herein by reference.

This application claims priority of Taiwan Patent Application No. 106110755, filed on Mar. 30, 2017, the entirety of which is incorporated by reference herein.

BACKGROUND OF THE INVENTION

Field of the Invention

The invention relates to a storage device, and more particularly, to a storage device with two connectors.

Description of the Related Art

Flash memory devices (such as flash drives) are among today's most popular electronic products. Because flash memory devices are small in size and light in weight and have the capacity to store a large amount of data, they are widely used in various fields. Generally, flash memory devices can be inserted into the universal serial bus (USB) ports of other electronic devices (such as desktop computers, notebook computers, or tablets) through the USB connectors of the flash memory devices, so that the electronic devices can write data into or read data from the flash memory devices.

However, the design of notebook computers and tablets has become more simplified. Thus, one notebook computer or tablet may have only one USB port. When a user inserts a flash memory device into the only USB port of the notebook or tablet computer to access data, the computer cannot be connected to another electric device (such as a smartphone) to charge it.

In view of this drawback, the development of a flash memory device which is capable of transmitting data and charging an electronic device at the same is an important issue.

BRIEF SUMMARY OF THE INVENTION

Thus, the present invention provides a storage device to solve the above problem.

One exemplary embodiment of a storage device is provided. The storage device comprises a first connector, a second connector, a controller circuit, a switch circuit, and a memory circuit. The controller circuit is disposed between the first connector and the second connector. The switch circuit is electrically connected between the first connector and the second connector. The switch circuit comprises a power-switching circuit, a control-switching circuit, and a data-switching circuit. The memory circuit is disposed between the first connector and the second connector. When the first connector is electrically connected to a first electronic device and the second connector is electrically connected to a second electronic device, the first connector receives a supply voltage from the first electronic device, and the data-switching circuit is switched to a first device state from a second device state according to the supply voltage, so that the first electronic can device access data in the memory circuit through the first connector, the data-switching circuit, and the controller circuit. The control-switching circuit is switched to a first control state from a second control state, so that the second connector is switched to a charge mode from a device mode. The power-switching circuit is switched to an on state from an off state according to the supply voltage, so that the second electronic device is charged by the supply voltage through the second connector.

Another exemplary embodiment of a storage device is provided. The storage device comprises a first connector, a second connector, and a memory circuit. The first connector is selectively electrically connected to a first electronic device. The second connector is selectively electrically connected to a second electronic device. The memory circuit is disposed between the first connector and the second connector. When the first connector is electrically connected to a first electronic device and the second connector is electrically connected to a second electronic device, the second connector is switched to a charge mode from a device mode, so that the first electronic device charges the second electronic device through the storage device, the second electronic device does not provide power to the storage device through the storage device, and the first electronic device accesses data in the storage device through the first connector.

An exemplary embodiment of an operation method of a storage device is provided. The storage device comprises a first connector, a second connector, and a memory circuit. The first connector is selectively electrically connected to a first electronic device. The second connector is selectively electrically connected to a second electronic device. The operation method comprises the following steps: when the first connector is electrically connected to a first electronic device and the second connector is electrically connected to a second electronic device, obtaining a supply voltage of the first electronic device by the storage device through the first connector; switching the second connector to a charge mode from a device mode according to the supply voltage; providing the supply voltage to the second electronic device by the storage device through the second connector; and transmitting data to and receiving data from the first electronic device by the storage device through the first connector.

Another exemplary embodiment of a storage device is provided. The storage device comprises a first connector and a second connector. When the first connector is electrically connected to a first electronic device (such as a tablet) and the second connector is electrically connected to a second electronic device (such as a smartphone), a power-switching circuit is automatically switched to an on state according to the supply voltage provided by the first electronic device, and the control-switching circuit is switched to a first control state, so that the second connector 104 is switched to a charge mode from a device mode. Thus, the supply voltage provided by the first electronic device is applied to charge the second electronic device through the storage device, and, at the same time, the first electronic device can access data in the storage device. During use, the user does not need to manually switch the storage device. The operations and processes described above can be achieved only by electrically connecting the storage device to the first electronic device and the second electronic device. Thus, the problem of the tablet not being able to connect to the flash memory and charge the smartphone at the same time due to the tablet not having enough universal serial bus connectors can be solved.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Various embodiments of the invention are described with reference to the accompanying drawings in detail. The same reference numbers are used throughout the drawings to refer to the same or like components. These embodiments are made for the purpose of illustrating the general principles of the invention and should not be taken in a limiting sense. Detailed descriptions of well-known functions and structures are omitted to avoid obscuring the subject matter of the invention.

It should be noted that different references to "an" or "one" embodiment in this disclosure are not necessarily references to the same embodiment, and such references mean "at least one." Furthermore, when a particular feature, structure, or characteristic is described in connection with an embodiment, it is submitted that it is within the knowledge of one skilled in the art to effect such a feature, structure, or characteristic in connection with other embodiments, whether described explicitly or not.

Figure 1:
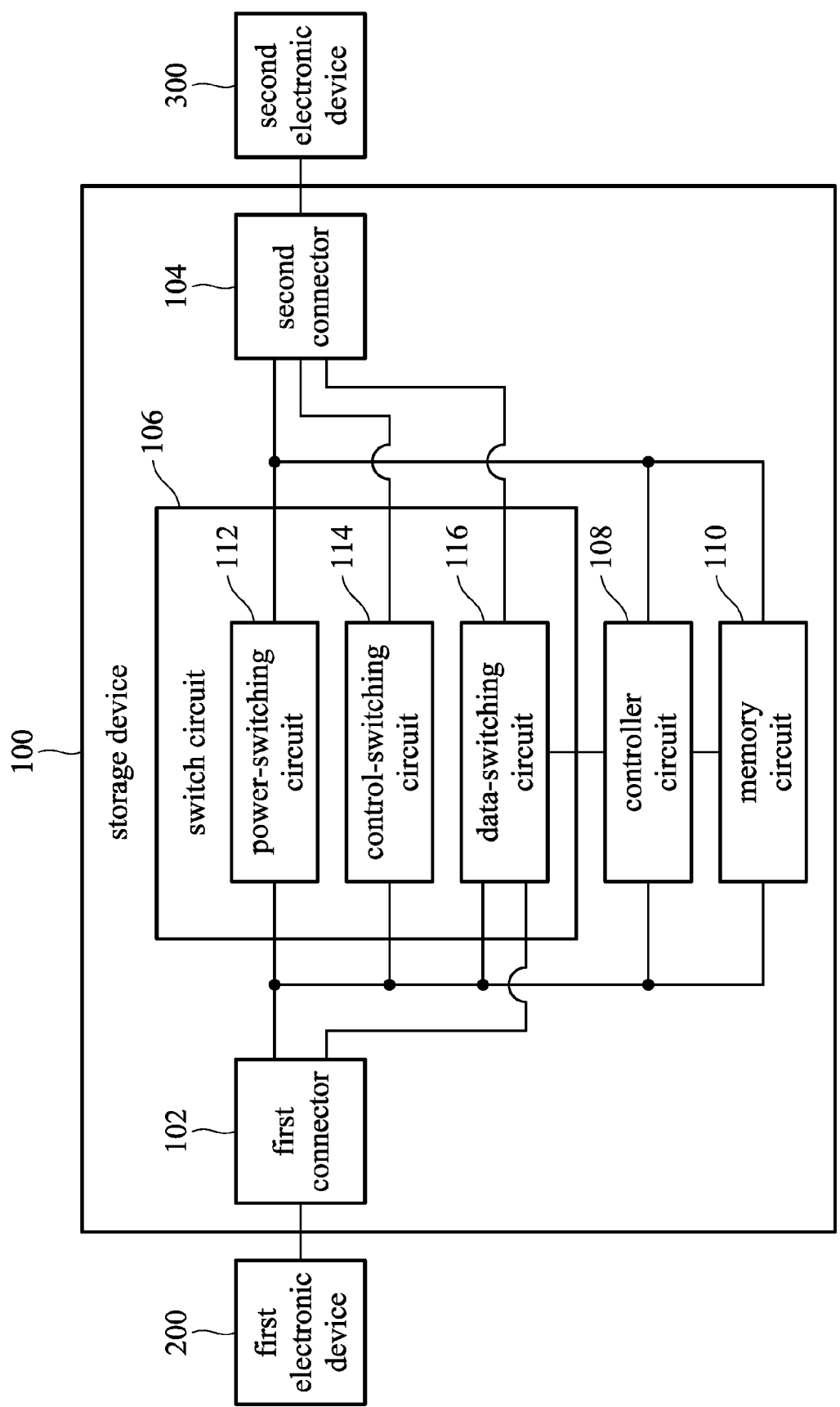
FIG. 1 shows an exemplary embodiment of a storage device and external devices.

Refer to FIG. 1, which is a schematic diagram showing an exemplary embodiment of a storage device and external devices. A storage device 100 is designed with the size and appearance of a flash drive, so that the storage device 100 can be conveniently carried by a user. The storage device 100 may comprise a first connector 102, a second connector 104, a switch circuit 106, a controller circuit 108, and a memory circuit 110. The first connector 102 may be implemented by a universal serial bus Type-A connector (USB Type-A connector), a mini USB Type-B connector, a micro USB Type-B connector, or a USB Type-C connector. The second connector 104 can be a mini USB Type-B connector, a micro USB Type-B connector, or a USB Type-C connector. The first connector 102 can be selectively connected to a first electronic device 200 which is disposed outside of the storage device 100, such as a notebook computer or a tablet, while the second connector 104 can be selectively connected to a second electronic device 300 which is disposed outside of the storage device 100, such as a smartphone or a mobile device.

The switch circuit 106 is electrically connected between the first connector 102 and the second connector 104. The switch circuit 106 may comprise a power-switching circuit 112, a control-switching circuit 114, and a data-switching circuit 116. The power-switching circuit 112 is switched between an off state and an on state according to a voltage received by the power-switching circuit 112. The control-switching circuit 114 is switched between a first control state and a second control state according to a voltage received by the control-switching circuit 114. The data-switching circuit 116 is switched between a first device state and a second device state according to a voltage received by the data-switching circuit 116. At least one of the above voltages can be a supply voltage Vbus provided by the first electronic device 200 through the first connector 102 when the first connector 102 is electrically connected to the first electronic device 200.

The controller circuit 108 is disposed between the first connector 102 and the second connector 104. The memory circuit 110 is disposed between the first connector 102 and the second connector 104. The memory circuit 110 can be a flash memory, such as a NOR flash memory or a NAND flash memory, for storing various types of digital data. When the first connector 102 or the second connector 104 is electrically connected to an external device, the external device can access the data stored in the memory circuit 110 through the controller circuit 108, such as for reading or writing data.

Figure 2:
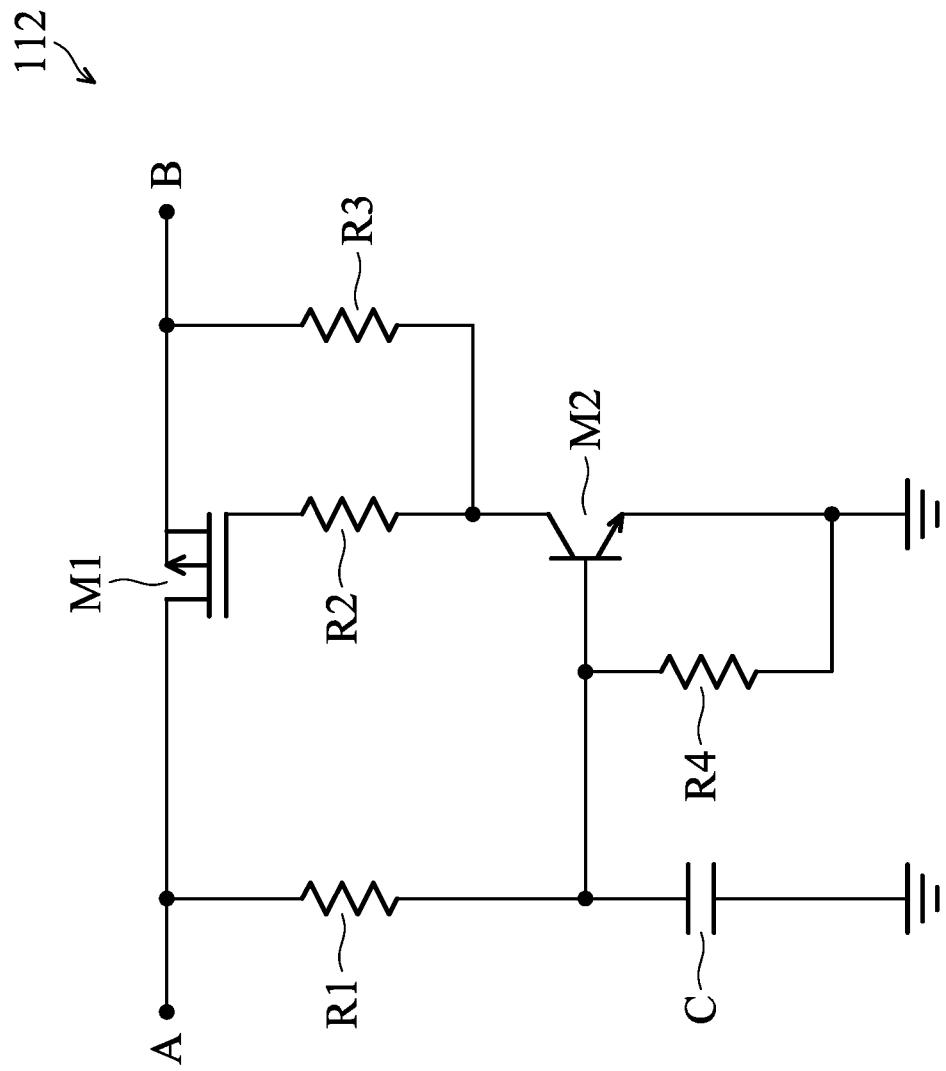
FIG. 2 shows an exemplary embodiment of a power-switching circuit.

Refer to FIG. 2, which shows an exemplary embodiment of the power-switching circuit 112. The power-switching circuit 112 may comprise a first resistor R1, a capacitor C, a first transistor M1, a second resistor R2, a third resistor R3, a second transistor M2, and a fourth resistor R4. The first resistor R1 has a first terminal and a second terminal. The first terminal of the first resistor R1 is electrically connected to a power pin of the first connector 102 which is represented by a connection point A shown in FIG. 2. The capacitor C has a first terminal and a second terminal. The first terminal of the capacitor C is electrically connected to the second terminal of the first resistor R1, and the second terminal of the capacitor C is electrically connected to a ground. The first transistor M1 has a first terminal, a second terminal, and a control terminal. The first terminal of the first transistor M1 is electrically connected to the power pin of the first connector 102. The second terminal of the first transistor M1 is electrically connected to a power pin of the second connector 104 which is represented by a connection point B shown in FIG. 2. The second resistor R2 has a first terminal and a second terminal. The first terminal of the second resistor R2 is electrically connected to the control terminal of the first transistor M1. The third resistor R3 has a first terminal and a second terminal. The first terminal of the third resistor R3 is electrically connected to the second terminal of the first transistor M1. The second transistor M2 has a first terminal, a second terminal, and a control terminal. The first terminal of the second transistor M2 is electrically connected to the second terminal of the second resistor R2 and the second terminal of the third resistor R3, the second terminal of the second transistor M2 is electrically connected to the ground, and the control terminal of the second transistor M2 is electrically connected to the first terminal of the capacitor C. The fourth resistor R4 has a first terminal and a second terminal. The first terminal of the fourth resistor R4 is electrically connected to the control terminal of the second transistor M2, and the second terminal of the fourth resistor R2 is electrically connected to the ground. In the embodiment, the first transistor M1 is a metal-oxide-semiconductor field-effect transistor (MOSFET), while the second transistor M2 is a bipolar junction transistor (BJT).

When the first connector 102 is not electrically connected to the first electronic device 200, the first connector 102 does not obtain the supply voltage Vbus from the first electronic device 200, so that the first connector 102 does not provide any power through the connection point A. At this time, the first transistor M1 and the second transistor M2 are turned off, and no power is provided to the connection point B from the connection point A through the first transistor M1. The state of the power-switching circuit 112 at this time is the above-described off state. When the first connector 102 is electrically connected to the first electronic device 200, the first connector 102 obtains the supply voltage Vbus of the first electronic device 200, and the first connector 102 provides the supply voltage Vbus to the power-switching circuit 112 through the connection point A. When the power-switching circuit 112 receives the supply voltage Vbus provided by the first electronic device 200, the second transistor M2 is turned on, and, thus, the first transistor M1 is turned on, so that the connection point A and the connection point B are electrically connected to each other. The state of the power-switching circuit 112 at this time is the above-described on state. Thus, the supply voltage Vbus is provided to the connection point B from the connection point A through the turned-on first transistor M1.

Figure 3:
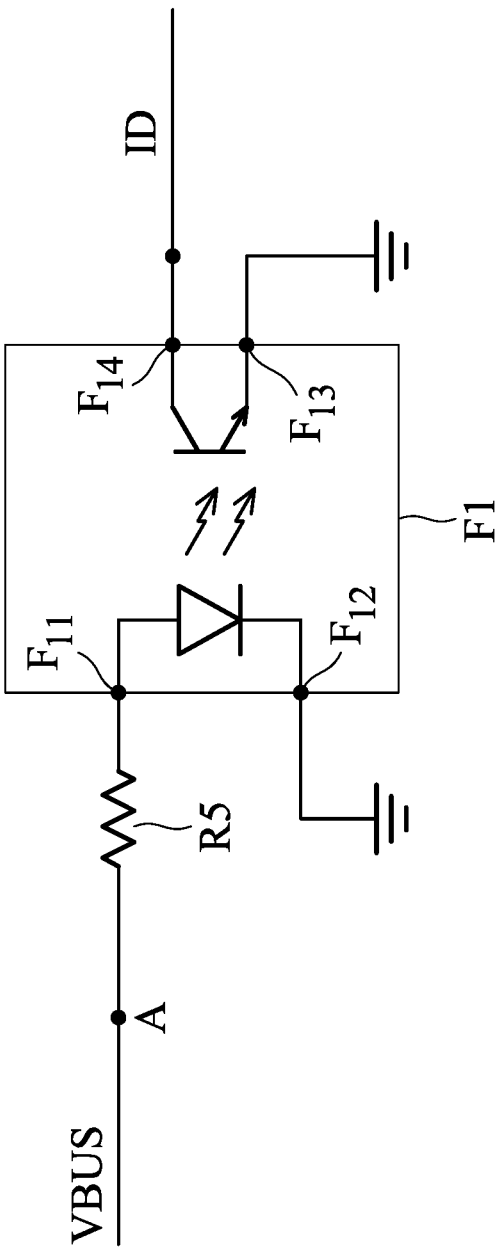
FIG. 3 shows one exemplary embodiment of a control-switching circuit.

Refer to FIG. 3, which shows one exemplary embodiment of the control-switching circuit 114. When the second connector 104 is a USB Type-B connector (such as a mini USB Type-B connector or micro USB Type-B connector), the control-switching circuit 114 may comprise a fifth resistor R5 and a first photo-coupling relay F1. The fifth resistor R5 has a first terminal and a second terminal. The first terminal of the fifth resistor R5 is electrically connected to the power pin of the first connector 102 (the connection point A). The first photo-coupling relay F1 has a first terminal F11, a second terminal F12, a third terminal F13, and a fourth terminal F14. The first terminal F11 of the first photo-coupling relay F1 is electrically connected the second terminal of the fifth resistor R5, the second terminal F12 and the third terminal F13 of the first photo-coupling relay F1 is coupled to the ground, and the fourth terminal F14 of the first photo-coupling relay F1 is electrically connected to a control terminal of the second connector 104 which is also referred to as a control pin ID.

When the control-switching circuit 114 does not receive the supply voltage Vbus (that is, when the first connector 102 is not electrically connected to the first electronic device 200), there is a short circuit between the third terminal F13 and the fourth terminal F14 of the first photo-coupling relay F1; in other words, the control pin ID is electrically connected to the ground. The state of the control-switching circuit 114 at this time is the above-described second control state. When the control-switching circuit 114 receives the supply voltage Vbus (that is, when the first connector 102 is electrically connected to the first electronic device 200), there is an open circuit between the third terminal F13 and the fourth terminal F14 of the first photo-coupling relay F1; in other words, the control pin ID is not electrically connected to the ground. The state of the control-switching circuit 114 at this time is the above-described first control state.

Figure 4:
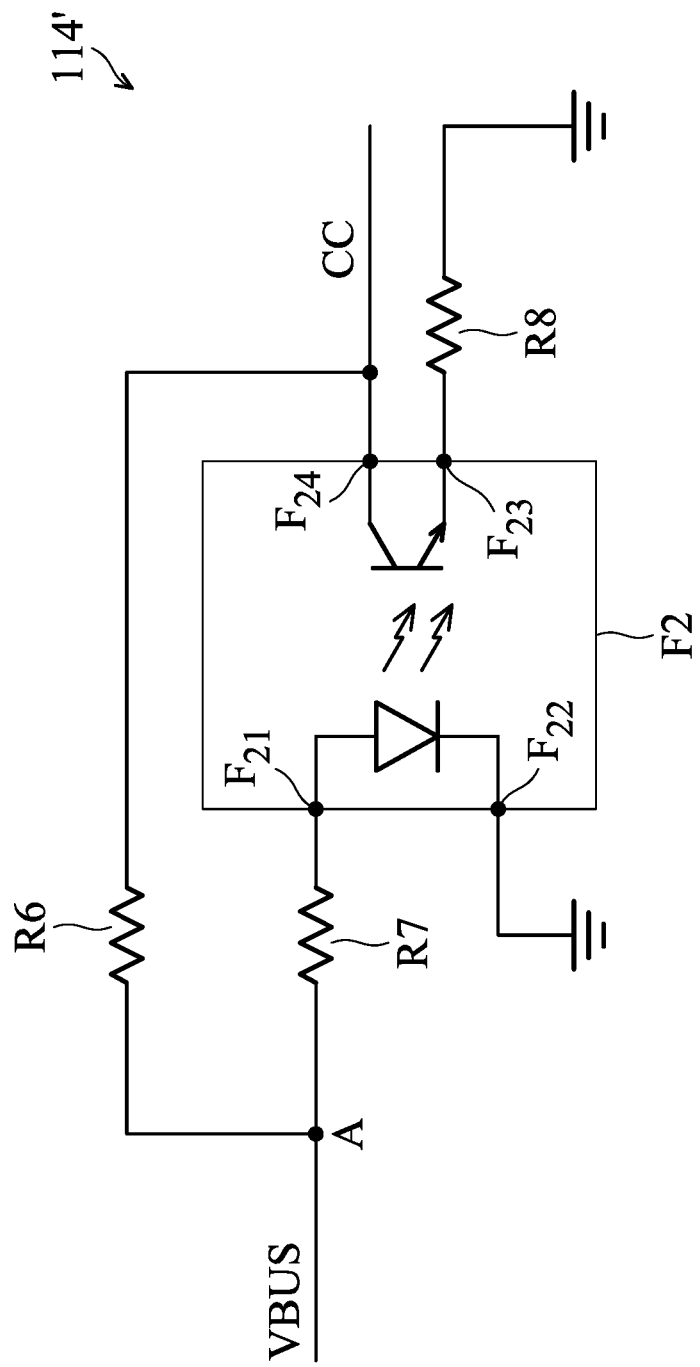
FIG. 4 shows another exemplary embodiment of a control-switching circuit.

Refer to FIG. 4, which shows another exemplary embodiment of the control-switching circuit 114'. In the embodiment, the second connector 104 is a USB Type-C connector. The control-switching circuit 114' may comprise a sixth resistor R6, a seventh resistor R7, an eighth resistor R8, and a second photo-coupling relay F2. The sixth resistor R6 has a first terminal and a second terminal. The first terminal of the sixth resistor R6 is electrically connected to the power pin of the first connector 102 (the connection point A). The seventh resistor R7 has a first terminal and a second terminal. The first terminal of the seventh resistor R7 is electrically connected to the power pin of the first connector 102. The second photo-coupling relay F2 has a first terminal F21, a second terminal F22, a third terminal F23, and a fourth terminal F24. The first terminal F21 of the second photo-coupling relay F2 is electrically connected the second terminal of the seventh resistor R7, the second terminal F22 of the second photo-coupling relay F2 is electrically connected to the ground, and the fourth terminal F24 of the second photo-coupling relay F2 is electrically connected to a control terminal of the second connector 104 which is also referred to as a configuration channel pin CC. The eighth resistor R8 has a first terminal and a second terminal. The first terminal of the eighth resistor R8 is electrically connected to the third terminal F23 of the second photo-coupling relay F2, and the second terminal of the eighth resistor R8 is electrically connected to the ground.

When the control-switching circuit 114' does not receive the supply voltage Vbus, there is a short circuit between the third terminal F23 and the fourth terminal F24 of the second photo-coupling relay F2; in other words, the configuration channel CC is electrically connected to the ground. The state of the control-switching circuit 114' at this time is the above-described second control state. When the control-switching circuit 114' receives the supply voltage Vbus, there is an open circuit between the third terminal F23 and the fourth terminal F24 of the second photo-coupling relay F2; in other words, the configuration channel pin CC is not electrically connected to the ground. The state of the control-switching circuit 114' at this time is the above-described first control state.

Figure 5:
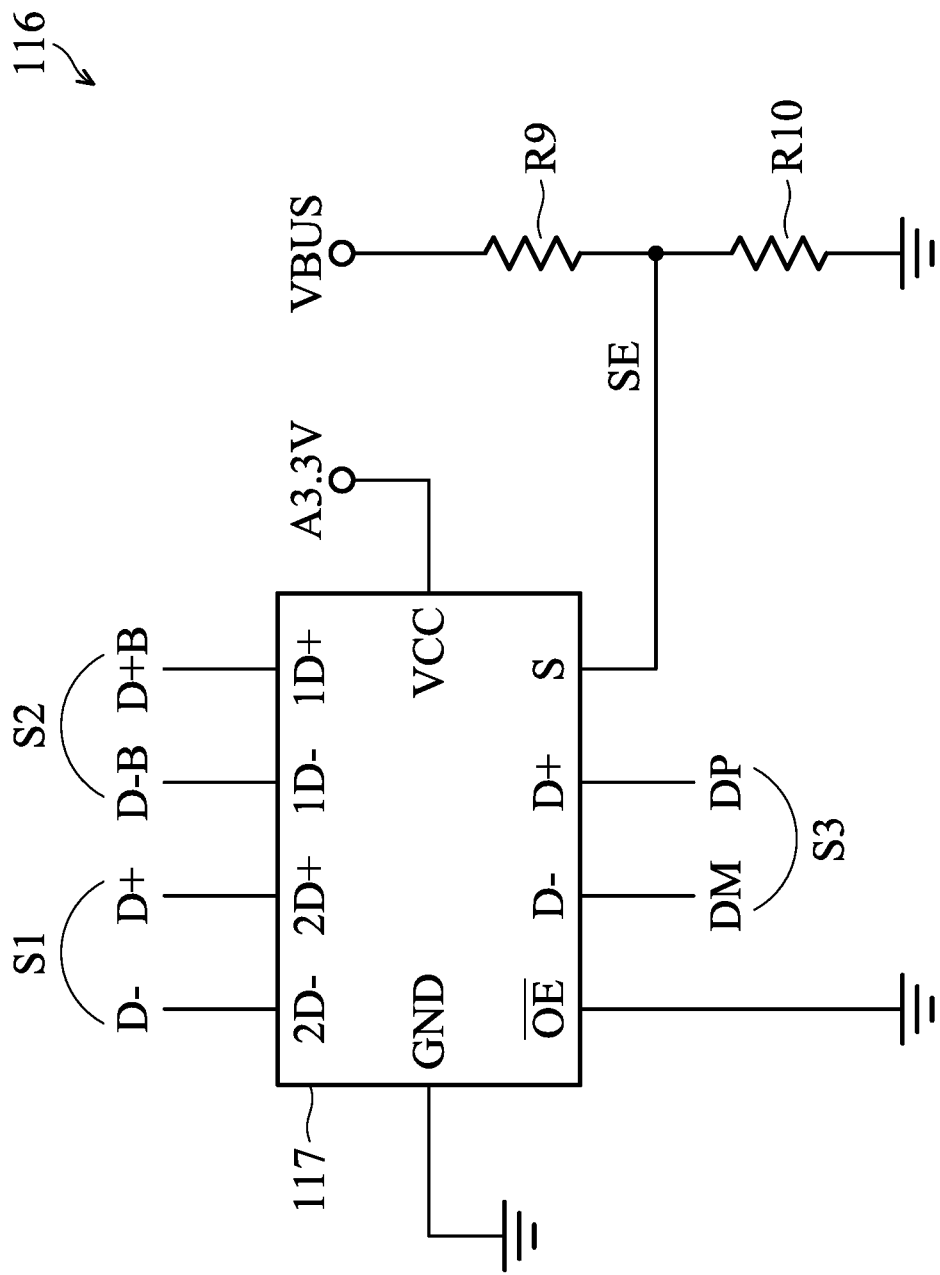
FIG. 5 shows an exemplary embodiment of a data-switching circuit.

Refer to FIG. 5, which shows an exemplary embodiment of the data-switching circuit 116. The data-switching circuit 116 may comprise an USB switch 117 and one set of voltage-dividing resistors. The USB switch 117 has a first set of signal terminals S1, a second set of signal terminals S2, a third set of signal terminals S3, and a selection terminal SE. The set of voltage-dividing resistors may comprise a ninth resistor R9 and a tenth resistor R10. The first set of signal terminals S1 is electrically connected to the signal pin of the first connector 102. The second set of signal terminals S2 is electrically connected to the signal pin of the second connector 104. The third set of signal terminals S3 is electrically connected to the controller circuit 108. The selection terminal SE is electrically connected to a voltage connection point between the ninth resistor R9 and the tenth resistor R10. A first terminal of the ninth resistor R9 is electrically connected to the power pin of the first connector 102. A first terminal of the tenth resistor R10 and a second terminal of the ninth resistor R0 are electrically connected to the selection terminal. A second terminal of the tenth resistor R10 is coupled to the ground.

When the first terminal of the ninth resistor R9 does not receive the supply voltage Vbus, the selection terminal SE does not receive any voltage input. At this time, the second set of signal terminals S2 is electrically connected to the third set of signal terminals S3. The state of the data-switching circuit 116 at this time is the above-described second device state.

When the first terminal of the ninth resistor R9 receives the supply voltage Vbus, the selection terminal SE receives a divided voltage, which is derived from the supply voltage Vbus, at the voltage connection point (that is, the second terminal of the ninth resistor R9). At this time, the connection between the third set of signal terminals S3 and the second set of signal terminals S2 is broken, and the third set of signal terminals S3 is electrically connected to the first set of signal terminals S1. The state of the data-switching circuit 116 at this time is the above-described first device state. Thus, when the first connector 102 is electrically connected to the first electronic device 200, the data-switching circuit 116 is switched to the first device state from the second device state, so that the signals which are transmitted from the first connector 102 and received by the first set of signal terminals S1 can be transmitted to the third set of signal terminals S3.

In the following paragraphs, various ways of using the storage device 100 will be described. In cases where the first connector 102 is not electrically connected to the first electronic device 200 and the second connector 104 is not electrically connected to the second electronic device 300, since the first connector 102 does not provide the supply voltage Vbus, the power-switching circuit 112 is in the off state, the control-switching circuit 114 is in the second control state, and the data-switching circuit 116 is in the second device state. Moreover, in these cases, the first connector 102 is in a device mode, and the second connector 104 is also in the device mode.

When only the first connector 102 is electrically connected to the first electronic device 200, the first electronic device 200 provides the supply voltage Vbus to the data-switching circuit 116, the controller circuit 108, and the memory circuit 110 through the first connector 102. The data-switching circuit 106 is then switched to the first device state from the second device state according to the supply voltage Vbus, as described above, so that the first electronic device 200 can access data in the memory circuit 110 through the first connector 102, the data-switching circuit 116, and the controller circuit 108.

When only the second connector 104 is electrically connected to the second electronic device 300, the second electronic device 300 provides the supply voltage Vbus to the controller circuit 108 and the memory circuit 110 through the second connector 104. Since the data-switching circuit 116 does not receive the supply voltage Vbus provided by the first connector 102, the data-switching circuit 106 remains in the second device state. Thus, the second electronic device 300 can access data in the memory circuit 110 through the second connector 104, the data-switching circuit 116, and the controller circuit 108.

When the first connector 102 is electrically connected to the first electronic device 200 and the second connector 104 is electrically connected to the second electronic device 300, the first connector 102 receives the supply voltage Vbus provided by the first electronic device 200 and provides the supply voltage Vbus to the power-switching circuit 112, the control-switching circuit 114, the data-switching circuit 116, the controller circuit 108, and the memory circuit 110. Thus, the data-switching circuit 116 is switched to the first device state from the second device state according to the supply voltage Vbus provided by the first connector 102, so that the first electronic device 200 can access data in the memory circuit 110 through the first connector 102, the data-switching circuit 116, and the controller circuit 108. The control-switching circuit 114 is switched to first control state from the second control state according to the supply voltage Vbus provided by the first connector 102, so that the second connector 104 is switched to a charge mode from the device mode. In other words, when the control terminal of the second connector 104 is electrically connected to the ground, the second connector 104 is in the device mode; when the control terminal of the second connector 104 is not electrically connected to the ground, the second connector 104 is in the charge mode. When the second connector 104 is in the charge mode, the second electronic device 300 does not provide power to the storage device 100 through the second connector 104. Moreover, the power-switching circuit 112 is switched to the on state from the off state according to the supply voltage Vbus provided by the first connector 102. Thus, the supply voltage Vbus provided by the first connector 102 is provided provide to the second electronic device 300 through the power-switching circuit 112 and the second connector 104, thereby charging the second electronic device 300.

Figure 6A:
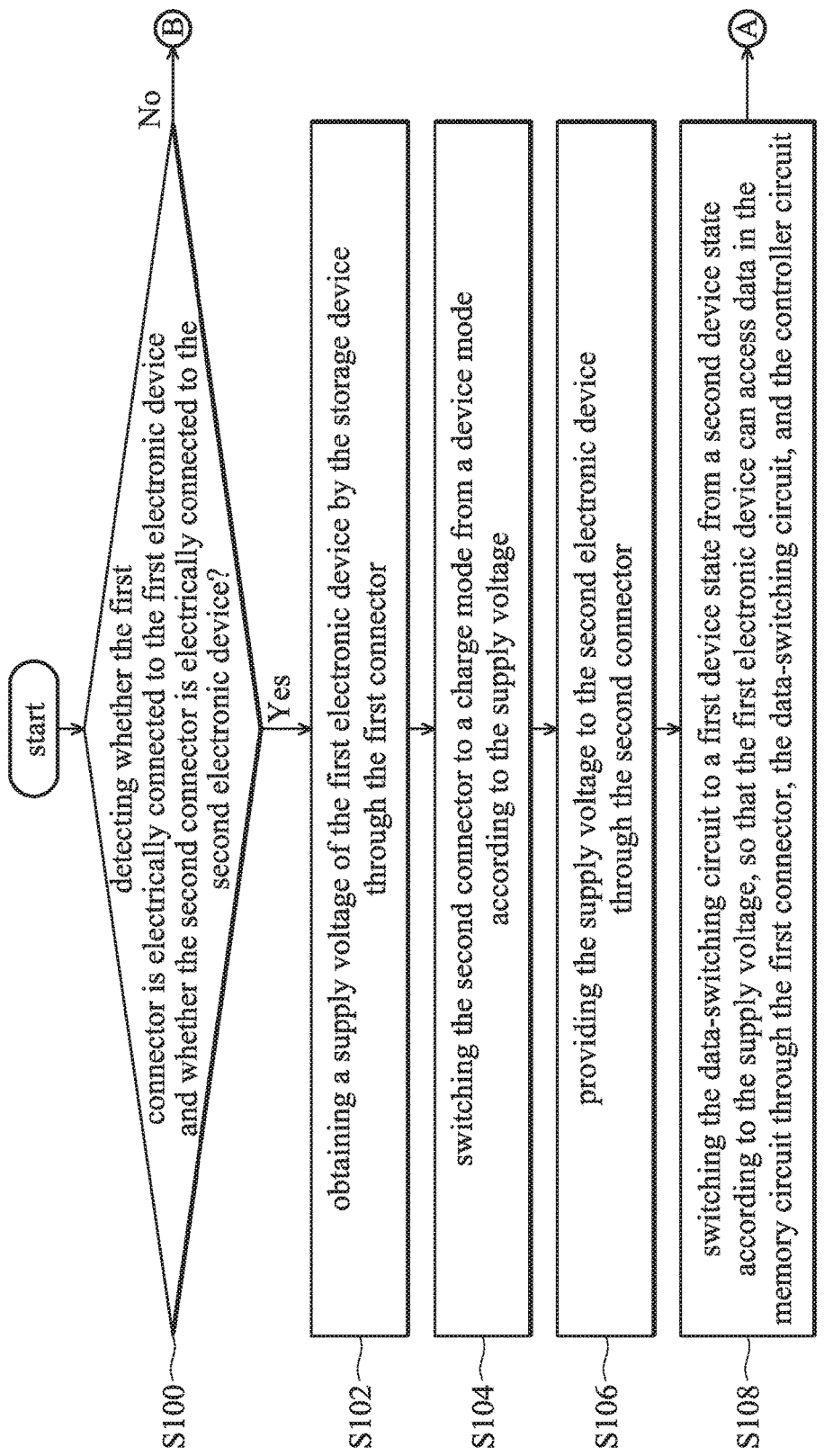
FIGS. 6A and 6B show an exemplary embodiment of an operation method of the storage device.
Figure 6B:
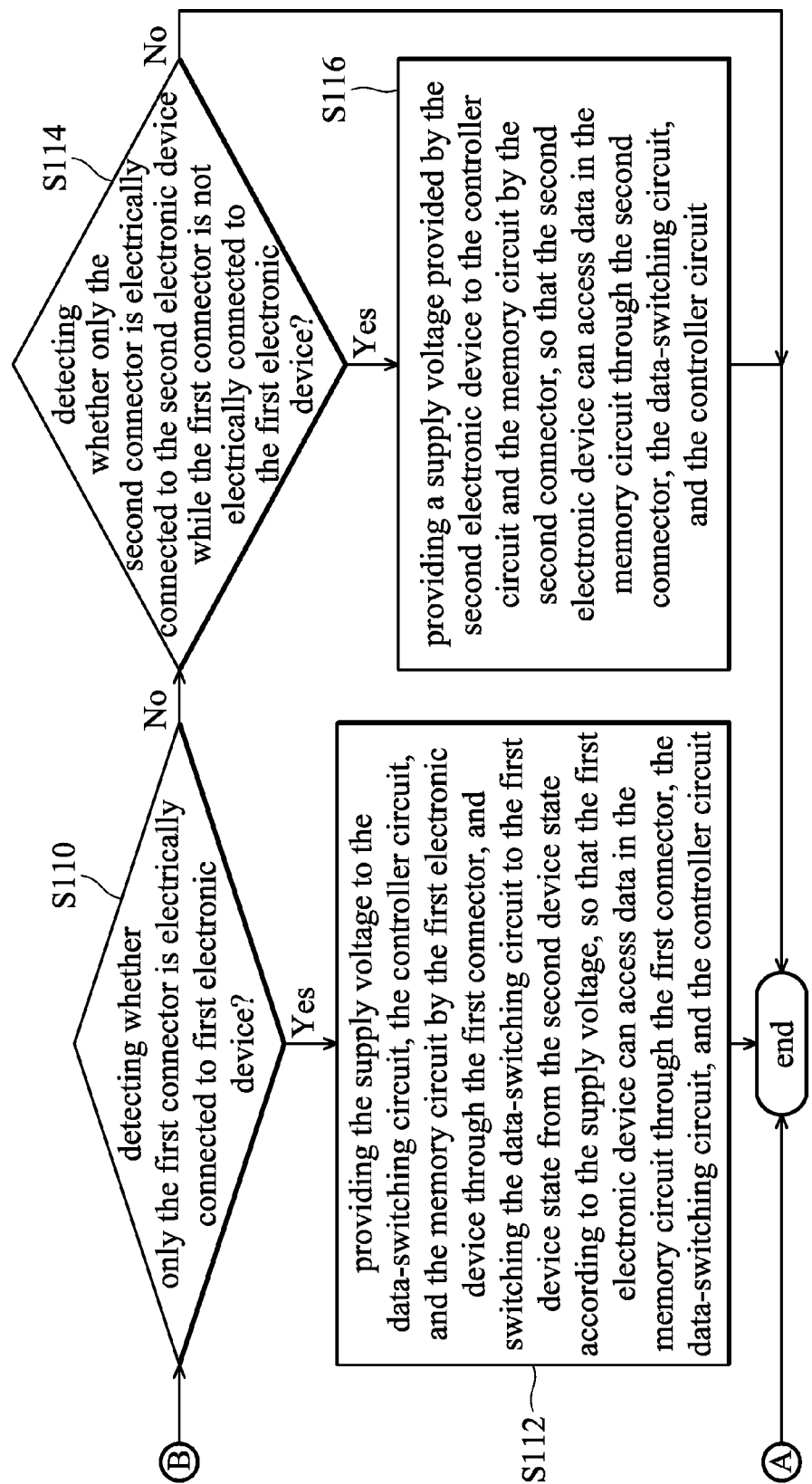

FIGS. 6A and 6B show an exemplary embodiment of an operation method of the storage device 100. In Step S100, it is detected whether the first connector 102 is electrically connected to the first electronic device 200 and whether the second connector 104 is electrically connected to the second electronic device 300. If the detection result of Step 100 is "Yes", the operation method proceeds to Step S102. If the detection result of Step 100 is "No", the operation method proceeds to Step S110. In Step 102, when the first connector 102 is electrically connected to the first electronic device 200 and the second connector 104 is electrically connected to the second electronic device 300, the storage device 100 obtains a supply voltage Vbus of the first electronic device 200 through the first connector 102.

In Step S104, the second connector 104 is switched to a charge mode from a device mode according to the supply voltage Vbus. In Step S106, the storage device 100 provides the supply voltage Vbus to the second electronic device 300 through the second connector 104, wherein the second electronic device 300 does not provide power to the storage device 100 through the second connector 104. In Step S108, the data-switching circuit 116 is switched to a first device state from a second device state according to the supply voltage Vbus, so that the first electronic device 200 can access data in the memory circuit 110 through the first connector 102, the data-switching circuit 116, and the controller circuit 108; in other words, the memory circuit 110 transmits data to and receives data from the first electronic device 200 through the first connector 102.

In step S110, it is detected whether only the first connector 102 is electrically connected to the first electronic device 200. If the detection result of Step 110 is "Yes", the operation method proceeds to Step S112. If the detection result of Step 110 is "No", the operation method proceeds to Step S114. In Step S112, when only the first connector 102 is electrically connected to the first electronic device 200, the first electronic device 200 provides the supply voltage Vbus to the data-switching circuit 116, the controller circuit 108, and the memory circuit 110 through the first connector 102, and the data-switching circuit 116 is switched to the first device state from the second device state according to the supply voltage Vbus, so that the first electronic device 200 can access data in the memory circuit 110 through the first connector 102, the data-switching circuit 116, and the controller circuit 108.

In Step S114, it is detected whether only the second connector 104 is electrically connected to the second electronic device 300 while the first connector 102 is not electrically connected to the first electronic device 200. If the detection result of Step 114 is "Yes", the operation method proceeds to Step S116. If the detection result of Step 114 is "No" which indicates that the second connector 104 is not electrically connected to the second electronic device 300 and the first connector 102 is not electrically connected to the first electronic device 200, the operation method ended. In Step S116, when only the second connector 104 is electrically connected to the second electronic device 300, the second connector 104 provides a supply voltage Vbus provided by the second electronic device 300 to the controller circuit 108 and the memory circuit 110, so that the second electronic device 300 can access data in the memory circuit 110 through the second connector 104, the data-switching circuit 116, and the controller circuit 108.

The embodiments of the present invention provide a storage device 100 which comprises a first connector 102 and a second connector 104. When the first connector 102 is electrically connected to a first electronic device 200 (such as a tablet) and the second connector 104 is electrically connected to a second electronic device 300 (such as a smartphone), a power-switching circuit 112 is automatically switched to an on state according to the supply voltage Vbus provided by the first electronic device 200, and the control-switching circuit 114 is switched to a first control state, so that the second connector 104 is switched to a charge mode from a device mode. Thus, the supply voltage Vbus provided by the first electronic device 200 is applied to charge the second electronic device 300 through the storage device 100, and, at the same time, the first electronic device 200 can access data in the storage device 100. Compared with conventional techniques, the user does not need to manually switch the storage device 100 during use. The above-described operations and processes can be achieved only by electrically connecting the storage device 100 to the first electronic device 200 and the second electronic device 300. Thus, the problem of the tablet not being able to connect to the flash memory and charge the smartphone at the same time due the tablet not having enough universal serial bus connectors can be solved.

It should be understood that the elements and features recited in the appended claims may be combined in different ways to produce new claims that likewise fall within the scope of the invention. Thus, whereas the dependent claims appended below depend from only a single independent or dependent claim, it should be understood that these dependent claims may, alternatively, be made to depend in the alternative from any preceding or following claim, and that such new combinations are to be understood as forming a part of the specification of the invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A storage device comprising:
   a first connector;
   a second connector;
   a controller circuit disposed between the first connector and the second connector;
   a switch circuit electrically connected between the first connector and the second connector, wherein the switch circuit comprises a power-switching circuit, a control-switching circuit, and a data-switching circuit; and
   a memory circuit disposed between the first connector and the second connector,
   wherein when the first connector is electrically connected to a first electronic device and the second connector is electrically connected to a second electronic device,
   the first connector receives a supply voltage from the first electronic device,
   the data-switching circuit is switched to a first device state from a second device state according to the supply voltage, so that the first electronic device can access data in the memory circuit through the first connector, the data-switching circuit, and the controller circuit,
   the control-switching circuit is switched to a first control state from a second control state, so that the second connector is switched to a charge mode from a device mode, and
   the power-switching circuit is switched to an on state from an off state according to the supply voltage, so that the second electronic device is charged by the supply voltage through the second connector.

2. The storage device as claimed in claim 1, wherein when the first connector is not electrically connected to the first electronic device and the second connector is not electrically connected to the second electronic device, the first connector is configured in device mode, the second connector is configured in device mode, the power-switching circuit is configured in the off state, the control-switching circuit is configured in the second control state, and the data-switching circuit is configured in the second device state.

3. The storage device as claimed in claim 1, wherein when only the first connector is electrically connected to the first electronic device, the first electronic device provides the supply voltage to the data-switching circuit, the controller circuit, and the memory circuit through the first connector, and the data-switching circuit is switched to the first device state from the second device state according to the supply voltage, so that the first electronic device can access data in the memory circuit through the first connector, the data-switching circuit, and the controller circuit.

4. The storage device as claimed in claim 1, wherein when only the second connector is electrically connected to the second electronic device, the second electronic device provides a supply voltage to the controller circuit and the memory circuit through the second connector, and the data-switching circuit remains in the second device state, so that the second electronic device can access data in the memory circuit through the second connector, the data-switching circuit, and the controller circuit.

5. The storage device as claimed in claim 1, wherein the power-switching circuit comprises:
   a first resistor having a first terminal and a second terminal, wherein the first terminal of the first resistor is electrically connected to the first connector;
   a capacitor having a first terminal and a second terminal, wherein the first terminal of the capacitor is electrically connected to the second terminal of the first resistor, and the second terminal of the capacitor is electrically connected to a ground;
   a first transistor having a first terminal, a second terminal, and a control terminal, wherein the first terminal of the first transistor is electrically connected to the first connector, and the second terminal of the first transistor is electrically connected to the second connector;
   a second resistor having a first terminal and a second terminal, wherein the first terminal of the second resistor is electrically connected to the control terminal of the first transistor;
   a third resistor having a first terminal and a second terminal, wherein the first terminal of the third resistor is electrically connected to the second terminal of the first transistor;
   a second transistor having a first terminal, a second terminal, and a control terminal, wherein the first terminal of the second transistor is electrically connected to the second terminal of the second resistor and the second terminal of the third resistor, the second terminal of the second transistor is electrically connected to the ground, and the control terminal of the second transistor is electrically connected to the first terminal of the capacitor; and a fourth resistor having a first terminal and a second terminal, wherein the first terminal of the fourth resistor is electrically connected to the control terminal of the second transistor, and the second terminal of the fourth resistor is electrically connected to the ground.

6. The storage device as claimed in claim 1, wherein the second connector is a universal serial bus (USB) Type-B connector, and the control-switching circuit comprises:

a fifth resistor having a first terminal and a second terminal, wherein the first terminal of the fifth resistor is electrically connected to the first connector; and a photo-coupling relay having a first terminal, a second terminal, a third terminal, and a fourth terminal, wherein the first terminal of the photo-coupling relay is electrically connected to the second terminal of the resistor, the second terminal and the third terminal of the photo-coupling relay are coupled to a ground, and the fourth terminal of the photo-coupling relay is electrically connected to a control terminal of the second connector, wherein when the control-switching circuit does not receive the supply voltage, there is a short circuit between the third terminal and the fourth terminal of the photo-coupling relay, and wherein when the control-switching circuit receives the supply voltage, there is an open circuit between the third terminal and the fourth terminal of the photo-coupling relay.

7. The storage device as claimed in claim 1, wherein the second connector is a a universal serial bus (USB) Type-C connector, and the control-switching circuit comprises:

a first resistor having a first terminal and a second terminal, wherein the first terminal of the first resistor is electrically connected to the first connector;

a second resistor having a first terminal and a second terminal, wherein the first terminal of the second resistor is electrically connected to the first connector;

a photo-coupling relay having a first terminal, a second terminal, a third terminal, and a fourth terminal, wherein the first terminal of the photo-coupling relay is electrically connected the second terminal of the second resistor, the second terminal of the photo-coupling relay is electrically connected to a ground, and the fourth terminal of the photo-coupling relay is electrically connected to a control terminal of the second connector and the second terminal of the first resistor; and a third resistor having a first terminal and a second terminal, wherein the first terminal of the third resistor is electrically connected to the third terminal of the photo-coupling relay, and the second terminal of the third resistor is electrically connected to the ground, wherein when the control-switching circuit does not receive the supply voltage, there is a short circuit between the third terminal and the fourth terminal of the photo-coupling relay, and wherein when the control-switching circuit receives the supply voltage, there is an open circuit between the third terminal and the fourth terminal of the photo-coupling relay.

8. The storage device as claimed in claim 1, wherein the data-switching circuit comprises a universal serial bus (USB) switch having a first set of signal terminals, a second set of signal terminals, a third set of signal terminals, and a selection terminal, wherein the first set of signal terminals is electrically connected to the first connector, the second set of signal terminals is electrically connected to the second connector, the third set of signal terminals is electrically connected to the controller circuit, and the selection terminal is configured to receive a divided voltage of the supply voltage, and wherein when the selection terminal receives the divided voltage, the data-switching circuit is switched to the first device state from the second device state, so that signals received by the first set of signal terminals are transmitted to the third set of signal terminals.

9. A storage device comprising:

a first connector selectively electrically connected to a first electronic device;

a second connector selectively electrically connected to a second electronic device; and a memory circuit disposed between the first connector and the second connector, wherein when the first connector is electrically connected to a first electronic device and the second connector is electrically connected to a second electronic device, the second connector is switched to a charge mode from a device mode, so that the first electronic device charges the second electronic device through the storage device, the second electronic device does not provide power to the storage device through the storage device, and the first electronic device accesses data in the storage device through the first connector.

10. The storage device as claimed in claim 9, further comprising:

a control-switching circuit electrically connected between the first connector and the second connector; and a power-switching circuit electrically connected between the first connector and the second connector, wherein the first electronic device provides a supply voltage to the control-switching circuit and the power-switching circuit through the first connector, the control-switching circuit is switched to a first control state from a second control state, so that the second connector is switched to the charge mode from the device mode, and the power-switching circuit is switched to an on state from an off state according to the supply voltage, so that the supply voltage is provided to charge the second electronic device through the second connector.

11. The storage device as claimed in claim 10, wherein the power-switching circuit comprises:

a first resistor having a first terminal and a second terminal, wherein the first terminal of the first resistor is electrically connected to the first connector;

a capacitor having a first terminal and a second terminal, wherein the first terminal of the capacitor is electrically connected to the second terminal of the first resistor, and the second terminal of the capacitor is electrically connected to a ground;

a first transistor having a first terminal, a second terminal, and a control terminal, wherein the first terminal of the first transistor is electrically connected to the first connector, and the second terminal of the first transistor is electrically connected to the second connector;

a second resistor having a first terminal and a second terminal, wherein the first terminal of the second resistor is electrically connected to the control terminal of the first transistor;

a third resistor having a first terminal and a second terminal, wherein the first terminal of the third resistor is electrically connected to the second terminal of the first transistor;

a second transistor having a first terminal, a second terminal, and a control terminal, wherein the first terminal of the second transistor is electrically connected to the second terminal of the second resistor and the second terminal of the third resistor, the second terminal of the second transistor is electrically connected to the ground, and the control terminal of the second transistor is electrically connected to the first terminal of the capacitor; and a fourth resistor having a first terminal and a second terminal, wherein the first terminal of the fourth resistor is electrically connected to the control terminal of the second transistor, and the second terminal of the fourth resistor is electrically connected to the ground.

12. The storage device as claimed in claim 10, wherein the second connector is a universal serial bus (USB) Type-B connector, and the control-switching circuit comprises:

a fifth resistor having a first terminal and a second terminal, wherein the first terminal of the fifth resistor is electrically connected to the first connector; and a photo-coupling relay having a first terminal, a second terminal, a third terminal, and a fourth terminal, wherein the first terminal of the photo-coupling relay is electrically connected to the second terminal of the resistor, the second terminal and the third terminal of the photo-coupling relay are coupled to a ground, and the fourth terminal of the photo-coupling relay is electrically connected to a control terminal of the second connector, wherein when the control-switching circuit does not receive the supply voltage, there is a short circuit between the third terminal and the fourth terminal of the photo-coupling relay, and wherein when the control-switching circuit receives the supply voltage, there is an open circuit between the third terminal and the fourth terminal of the photo-coupling relay.

13. The storage device as claimed in claim 10, wherein the second connector is a universal serial bus (USB) Type-C connector, and the control-switching circuit comprises:

a first resistor having a first terminal and a second terminal, wherein the first terminal of the first resistor is electrically connected to the first connector;

a second resistor having a first terminal and a second terminal, wherein the first terminal of the second resistor is electrically connected to the first connector;

a photo-coupling relay having a first terminal, a second terminal, a third terminal, and a fourth terminal, wherein the first terminal of the photo-coupling relay is electrically connected the second terminal of the second resistor, the second terminal of the photo-coupling relay is electrically connected to a ground, and the fourth terminal of the photo-coupling relay is electrically connected to a control terminal of the second connector and the second terminal of the first resistor; and a third resistor having a first terminal and a second terminal, wherein the first terminal of the third resistor is electrically connected to the third terminal of the photo-coupling relay, and the second terminal of the third resistor is electrically connected to the ground, wherein when the control-switching circuit does not receive the supply voltage, there is a short circuit between the third terminal and the fourth terminal of the photo-coupling relay, and wherein when the control-switching circuit receives the supply voltage, there is an open circuit between the third terminal and the fourth terminal of the photo-coupling relay.

14. The storage device as claimed in claim 10, a data-switching circuit electrically connected between the first connector and the second connector; and a control-switching circuit electrically connected between the first connector and the second connector, wherein the first electronic device provides a supply voltage to the control-switching circuit and the power-switching circuit through the first connector, and the data-switching circuit is switched to a first device state from a second device state according to the supply voltage, so that the first electronic device can access data in the memory circuit through the first connector, the data-switching circuit, and the controller circuit.

15. The storage device as claimed in claim 14, wherein when only the second connector is electrically connected to the second electronic device, the second electronic device provides the supply voltage to the controller circuit and the memory circuit through the second connector, and the data-switching circuit remains in the second device state, so that the second electronic device can access data in the memory circuit through the second connector, the data-switching circuit, and the controller circuit.

16. The storage device as claimed in claim 14, wherein the data-switching circuit comprises a universal serial bus (USB) switch having a first set of signal terminals, a second set of signal terminals, a third set of signal terminals, and a selection terminal, wherein the first set of signal terminals is electrically connected to the first connector, the second set of signal terminals is electrically connected to the second connector, the third set of signal terminals is electrically connected to the controller circuit, and the selection terminal is configured to receive a divided voltage of the supply voltage, and wherein when the selection terminal receives the divided voltage, the data-switching circuit is switched to the first device state from the second device state, so that signals received by the first set of signal terminals are transmitted to the third set of signal terminals.

17. An operation method of a storage device, wherein the storage device comprises a first connector, a second connector, and a memory device, the first connector being selectively electrically connected to a first electronic device, the second connector being selectively electrically connected to a second electronic device, and the operation method comprises:

when the first connector is electrically connected to a first electronic device and the second connector is electrically connected to a second electronic device, obtaining a supply voltage of the first electronic device by the storage device through the first connector;

switching the second connector to a charge mode from a device mode according to the supply voltage;

providing the supply voltage to the second electronic device by the storage device through the second connector; and transmitting data to and receiving data from the first electronic device by the storage device through the first connector.

18. The operation method as claimed in claim 17, wherein the storage device further comprises a data-switching circuit and a controller circuit, and the step of transmitting data to and receiving data from the first electronic device by the storage device through the first connector comprises:

switching the data-switching circuit to a first device state from a second device state according to the supply voltage, so that the first electronic device can access data in the memory circuit through the first connector, the data-switching circuit, and the controller circuit.

19. The operation method as claimed in claim 17, wherein the storage device further comprises a data-switching circuit and a controller circuit, and the operation method further comprises:

providing the supply voltage to the controller circuit and the memory circuit by the second connector, so that the second electronic device can access data in the memory circuit through the second connector, the data-switching circuit, and the controller circuit.

20. The operation method as claimed in claim 17, wherein the storage device further comprises a data-switching circuit and a controller circuit, and the operation method further comprises:

when only the first connector is electrically connected to the first electronic device, providing the supply voltage to the data-switching circuit, the controller circuit, and the memory circuit by the first electronic device through the first connector, and the data-switching circuit is switched to a first state from a second state according to the supply voltage, so that the first electronic device can access data in the memory circuit through the first connector, the data-switching circuit, and the controller circuit.

\* \* \* \* \*